(12) United States Patent
Venema

(10) Patent No.: US 7,307,694 B2
(45) Date of Patent: Dec. 11, 2007

(54) LITHOGRAPHIC APPARATUS, RADIATION BEAM INSPECTION DEVICE, METHOD OF INSPECTING A BEAM OF RADIATION AND DEVICE MANUFACTURING METHOD

(75) Inventor: Willem Jurrianus Venema, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 97 days.

(21) Appl. No.: 11/169,307

(22) Filed: Jun. 29, 2005

(65) Prior Publication Data

US 2007/0002301 A1 Jan. 4, 2007

(51) Int. Cl.
*G03B 27/72* (2006.01)
*G03B 27/54* (2006.01)

(52) U.S. Cl. .......................................... 355/69; 355/67
(58) Field of Classification Search ................ 355/53, 355/55, 67–69; 250/372; 356/399–401
See application file for complete search history.

(56) References Cited

U.S. PATENT DOCUMENTS

| 5,229,872 | A | 7/1993 | Mumola |
|---|---|---|---|
| 5,296,891 | A | 3/1994 | Vogt et al. |
| 5,500,736 | A | 3/1996 | Koitabashi et al. |
| 5,523,193 | A | 6/1996 | Nelson |
| 5,530,482 | A | 6/1996 | Gove et al. |
| 5,579,147 | A | 11/1996 | Mori et al. |
| 5,677,703 | A | 10/1997 | Bhuva et al. |
| 5,808,797 | A | 9/1998 | Bloom et al. |
| 5,982,553 | A | 11/1999 | Bloom et al. |
| 6,133,986 | A | 10/2000 | Johnson |
| 6,177,980 | B1 | 1/2001 | Johnson |
| 6,333,777 | B1 * | 12/2001 | Sato ............................ 355/53 |
| 6,687,041 | B1 | 2/2004 | Sandstrom |
| 6,710,856 | B2 * | 3/2004 | Van Der Laan et al. ...... 355/71 |
| 6,747,783 | B1 | 6/2004 | Sandstrom |
| 6,781,135 | B2 * | 8/2004 | Berger ......................... 250/372 |
| 6,795,169 | B2 | 9/2004 | Tanaka et al. |
| 6,806,897 | B2 | 10/2004 | Kataoka et al. |
| 6,811,953 | B2 | 11/2004 | Hatada et al. |
| 7,116,402 | B2 * | 10/2006 | Gui .............................. 355/57 |
| 2004/0041104 | A1 | 3/2004 | Liebregts et al. |
| 2004/0130561 | A1 | 7/2004 | Jain |
| 2005/0007572 | A1 | 1/2005 | George et al. |

FOREIGN PATENT DOCUMENTS

| WO | WO98/33096 | 7/1998 |
|---|---|---|
| WO | WO98/38597 | 9/1998 |

OTHER PUBLICATIONS de Lima Monteiro, D.W. et al., "High-Speed Wavefront Sensor Compatible with Standard CMOS Technology", *Sensors and Actuators A* 109, 2004, pp. 220-230.

* cited by examiner

*Primary Examiner*—Henry Hung Nguyen
(74) *Attorney, Agent, or Firm*—Sterne, Kessler, Goldstein & Fox P.L.L.C.

(57) ABSTRACT

A lithographic apparatus having a radiation beam inspection device including a barrier to the beam of radiation, the barrier having an aperture through which a portion of the beam of radiation passes; and a radiation sensor that determines the intensity of the radiation passing through the aperture and the position, relative to the aperture, of the point at which the radiation is incident on the radiation sensor.

20 Claims, 13 Drawing Sheets

LITHOGRAPHIC APPARATUS, RADIATION BEAM INSPECTION DEVICE, METHOD OF INSPECTING A BEAM OF RADIATION AND DEVICE MANUFACTURING METHOD

BACKGROUND

1. Field

The present invention relates to a lithographic apparatus and a method for manufacturing a device.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred on (part of) the substrate (e.g., a glass plate), e.g., via imaging onto a layer of radiation-sensitive material (resist) provided on the substrate.

Instead of a circuit pattern, the patterning means can be used to generate other patterns, for example a color filter pattern or a matrix of dots. Instead of a mask, the patterning device can comprise a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or which covers a portion of the width (for example half of the width). The substrate can be scanned underneath the exposure region, while the mask or reticle is synchronously scanned through the projection beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

In a possible arrangement of a lithographic apparatus, an array of focusing elements, such as an array of lenses, is used to project a patterned beam of radiation onto the substrate. In such an arrangement, each focusing element projects a portion of the patterned beam of radiation onto the substrate. Accordingly, the radiation is projected onto the substrate as an array of sub-beams of radiation, forming spots on the substrate that are modulated according to the patterning device.

In order for a desired pattern to be successfully formed on the substrate, it is desirable for the spots projected on the substrate to be accurately positioned with respect to each other and to have a desired shape. The accuracy of the spot shapes and positions is primarily determined by the accuracy of manufacture of the array of focusing elements. It can be possible to compensate to some extent for some errors if these are precisely known. Accordingly, it can be desirable to determine the errors in the beam of radiation.

Therefore, what is needed is a system and method by which errors introduced in an array of spots by an array of focusing elements can be determined.

SUMMARY

In one embodiment of the present invention, there is provided a lithographic projection apparatus comprising a patterning device, a projection system, and a radiation beam inspection device. The patterning device modulates a beam of radiation. The projection system projects the modulated beam of radiation onto a target portion of a substrate. The radiation beam inspection device comprises a barrier to the radiation and a radiation sensor. The barrier has an aperture that permits a portion of the radiation beam to pass through the barrier. The radiation sensor detects the intensity of the radiation passing through the aperture and the position, relative to the aperture, at which the radiation passing through the aperture is incident on the radiation sensor.

In another embodiment of the present invention there is provided a radiation beam inspection device comprising a radiation barrier and a radiation sensor. The barrier has an aperture that permits a portion of a beam of radiation that is incident on the radiation beam inspection device to pass through the barrier. The radiation sensor detects the intensity of the radiation passing through the aperture and the position, relative to the aperture, at which the radiation passing through the aperture is incident on the radiation sensor.

In a further embodiment of the present invention, there is provided a method of inspecting a beam of radiation comprising the following steps. Inspecting at least a portion of the beam of radiation using a radiation beam inspection device comprising a barrier to the radiation, the barrier having an aperture that permits a portion of the radiation beam to pass through the barrier, and a radiation sensor. Using the radiation sensor to detect the intensity of the radiation passing through the aperture and the position, relative to the aperture, at which the radiation passing through the aperture is incident on the radiation sensor.

In a still further embodiment of the present invention, there is provided a device manufacturing method comprising the following steps. Using a lithographic apparatus to generate a beam of radiation. Inspecting the beam of radiation using the method of the embodiment described above and using the lithographic apparatus to project a modulated beam of radiation onto a substrate. At least one setting of the lithographic apparatus is set, for the step of projecting a modulated beam of radiation onto the substrate, using the results of the inspection step.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 1:
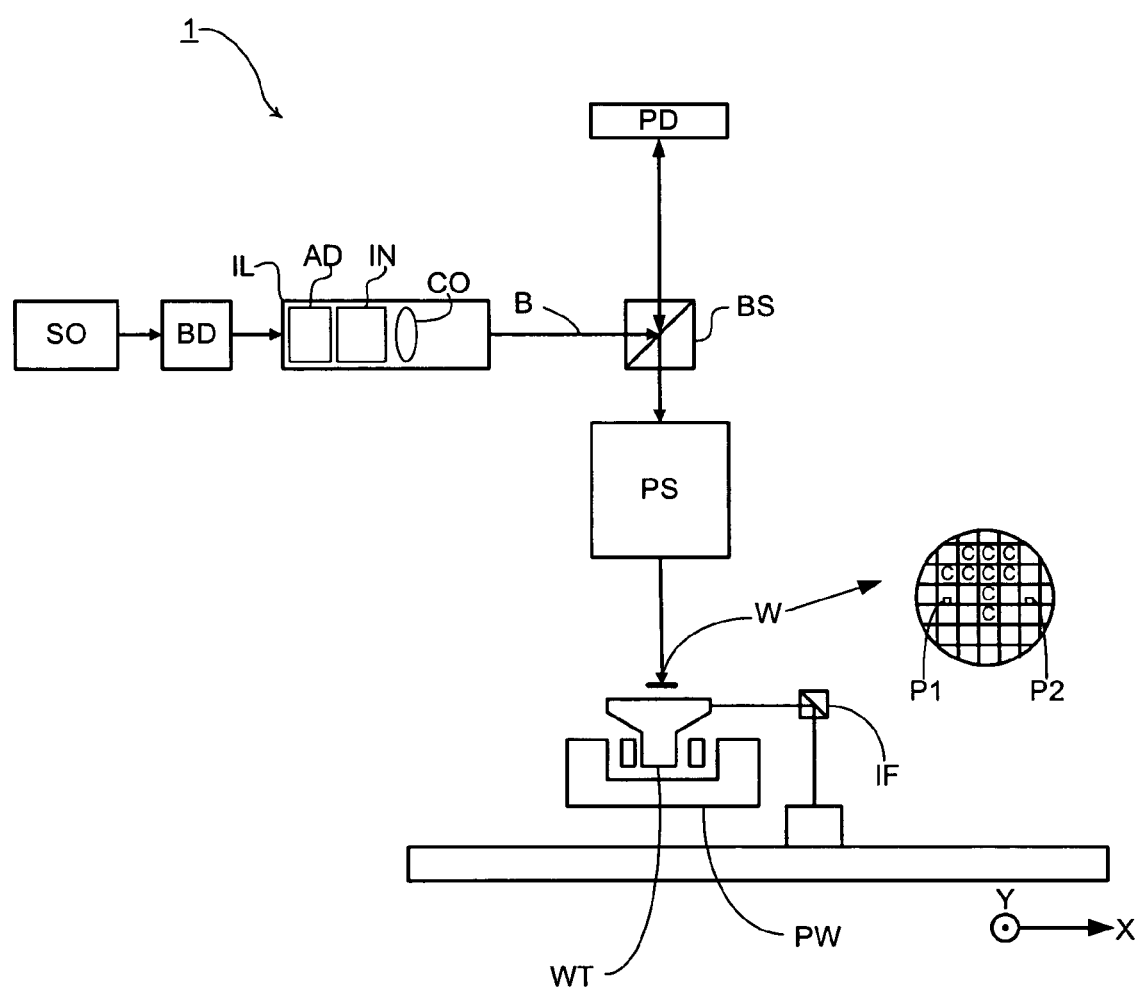
FIGS. 1 and 2 depict lithographic apparatus, according to various embodiments of the present invention.

The present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

FIG. 1 schematically depicts a lithographic apparatus according to one embodiment of the invention. The apparatus comprises an illumination system IL, a patterning device PD, a substrate table WT, and a projection system PS. The illumination system (illuminator) IL is configured to condition a radiation beam B (e.g., UV radiation).

The patterning device PD (e.g., a reticle or mask or an array of individually controllable elements) modulates the projection beam. In general, the position of the array of individually controllable elements will be fixed relative to the projection system PS. However, it can instead be connected to a positioner configured to accurately position the array of individually controllable elements in accordance with certain parameters.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W.

The illumination system can include various types of optical components, such as refractive, reflective, magnetic, electromagnetic, electrostatic or other types of optical components, or any combination thereof, for directing, shaping, or controlling radiation.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam can not exactly correspond to the desired pattern in the target portion of the substrate, for example if the pattern includes phase-shifting features or so called assist features. Similarly, the pattern eventually generated on the substrate can not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." In one example, the patterning device comprises at least 10 programmable elements, e.g., at least 100, at least 1000, at least 10000, at least 100000, at least 1000000, or at least 10000000 programmable elements.

A programmable mirror array can comprise a matrix-addressable surface having a viscoelastic control layer and a reflective surface. The basic principle behind such an apparatus is that, e.g., addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is comprised of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction to unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In an example, such as the embodiment depicted in FIG. 1, the substrate W has a substantially circular shape, optionally with a notch and/or a flattened edge along part of its perimeter. In an example, the substrate has a polygonal shape, e.g., a rectangular shape.

In example where the substrate has a substantially circular shape include examples where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In an embodiment, the substrate has a diameter of at most 500 mm, at most 400 mm, at most 350 mm, at most 300 mm, at most 250 mm, at most 200 mm, at most 150 mm, at most 100 mm, or at most 75 mm.

In examples where the substrate is polygonal, e.g., rectangular, include examples where at least one side, e.g., at least 2 sides or at least 3 sides, of the substrate has a length of at least 5 cm, e.g., at least 25 cm, at least 50 cm, at least 100 cm, at least 150 cm, at least 200 cm, or at least 250 cm.

In one example, at least one side of the substrate has a length of at most 1000 cm, e.g., at most 750 cm, at most 500 cm, at most 350 cm, at most 250 cm, at most 150 cm, or at most 75 cm.

In one example, the substrate W is a wafer, for instance a semiconductor wafer. In one example, the wafer material is selected from the group consisting of Si, SiGe, SiGeC, SiC, Ge, GaAs, InP, and InAs. In one example, the wafer is a III/V compound semiconductor wafer. In one example, the wafer is a silicon wafer. In an embodiment, the substrate is a ceramic substrate. In one example, the substrate is a glass substrate. In one example, the substrate is a plastic substrate.

In one example, the substrate is transparent (for the naked human eye). In one example, the substrate is colored. In one example, the substrate is absent a color.

The thickness of the substrate can vary and, to an extent, can depend, e.g., on the substrate material and/or the substrate dimensions. In one example, the thickness is at least 50 µm, e.g., at least 100 µm, at least 200 µm, at least 300 µm, at least 400 µm, at least 500 µm, or at least 600 µm. In one example, the thickness of the substrate is at most 5000 µm, e.g., at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array, e.g., to form the secondary sources and to image spots onto the substrate. In one example, the array of focusing elements (e.g., MLA) comprises at least 10 focus elements, e.g., at least 100 focus elements, at least 1000 focus elements, at least 10000 focus elements, at least 100000 focus elements, or at least 1000000 focus elements. In one example, the number of individually controllable elements in the patterning device is equal to or greater than the number of focusing elements in the array of focusing elements. In one example, one or more (e.g., 1000 or more, the majority, or about each) of the focusing elements in the array of focusing elements can be optically associated with one or more of the individually controllable elements in the array of individually controllable elements, e.g., with 2 or more of the individually controllable elements in the array of individually controllable elements, such as 3 or more, 5 or more, 10 or more, 20 or more, 25 or more, 35 or more, or 50 or more. In one example, the MLA is movable (e.g., with the use of actuators) at least in the direction to and away from the substrate, e.g., with the use of one or more actuators. Being able to move the MLA to and away from the substrate allows, e.g., for focus adjustment without having to move the substrate.

Figure 2:
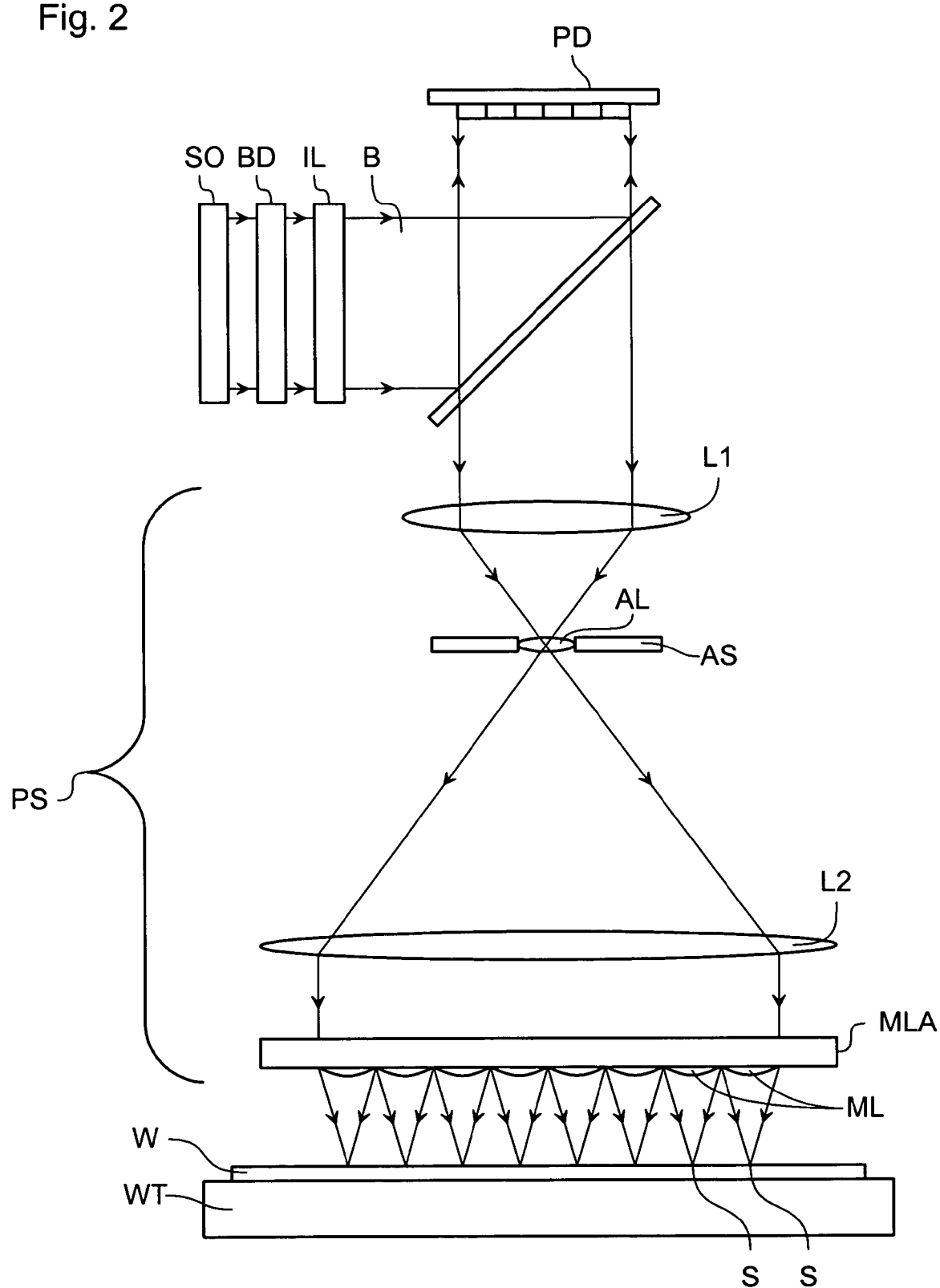

As herein depicted in FIGS. 1 and 2, the apparatus is of a reflective type (e.g., employing a reflective array of individually controllable elements). Alternatively, the apparatus can be of a transmissive type (e.g., employing a transmissive array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. In one example, the radiation source provides radiation having a wavelength of at least 5 nm, e.g., at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In one example, the radiation provided by radiation source SO has a wavelength of at most 450 nm, e.g., at most 425 nm, at most 375 nm, at most 360 nm, at most 325 nm, at most 275 nm, at most 250 nm, at most 225 nm, at most 200 nm, or at most 175 nm. In one example, the radiation has a wavelength including 436 nm, 405 nm, 365 nm, 355 nm, 248 nm, 193 nm, 157 nm, and/or 126 nm. In one example, the radiation includes a wavelength of around 365 nm or around 355 nm. In one example, the radiation includes a broad band of wavelengths, for example encompassing 365, 405, and 436 nm. A 355 nm laser source could be used. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In one example, the apparatus is absent at least a short stroke module for moving substrate table WT. A similar system can also be used to position the array of individually controllable elements. It will be appreciated that the projection beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. In one example, the beam of radiation is directed at the patterning device at an angle between 0 and 90°, e.g., between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 can not be required if a transmissive patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the projection beam B is caused to scan a line across the substrate W. The pattern on the array of individually controllable elements is updated as required between pulses of the radiation system and the pulses are timed such that successive target portions C are exposed at the required locations on the substrate W. Consequently, the projection beam B can scan across the substrate W to expose the complete pattern for a strip of the substrate. The process is repeated until the complete substrate W has been exposed line by line.

4. In continuous scan mode, essentially the same as pulse mode except that the substrate W is scanned relative to the modulated beam of radiation B at a substantially constant speed and the pattern on the array of individually controllable elements is updated as the projection beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary not only to maximum or minimum intensity levels but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (namely just a maximum value and a minimum value). In an embodiment, at least three different radiation intensity values can be projected onto the substrate, e.g., at least 4 radiation intensity values, at least 8 radiation intensity values, at least 16 radiation intensity values, at least 32 radiation intensity values, at least 64 radiation intensity values, at least 128 radiation intensity values, or at least 256 radiation intensity values.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. In an embodiment, the radiation dose profile has at least 2 desired dose levels, e.g., at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

In order to form the required pattern on the substrate, it is necessary to set each of the individually controllable elements in the patterning device to the requisite state at each stage during the exposure process. Therefore, control signals, representing the requisite states, must be transmitted to each of the individually controllable elements. In one example, the lithographic apparatus includes a controller that generates the control signals. The pattern to be formed on the substrate can be provided to the lithographic apparatus in a vector-defined format, such as GDSII. In order to convert the design information into the control signals for each individually controllable element, the controller includes one or more data manipulation devices, each configured to perform a processing step on a data stream that represents the pattern. The data manipulation devices can collectively be referred to as the "datapath."

The data manipulation devices of the datapath can be configured to perform one or more of the following functions: converting vector-based design information into bitmap pattern data; converting bitmap pattern data into a required radiation dose map (namely a required radiation dose profile across the substrate); converting a required radiation dose map into required radiation intensity values for each individually controllable element; and converting the required radiation intensity values for each individually controllable element into corresponding control signals.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

FIG. 2 depicts an arrangement of a lithographic apparatus, according to one embodiment of the present invention. This embodiment can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
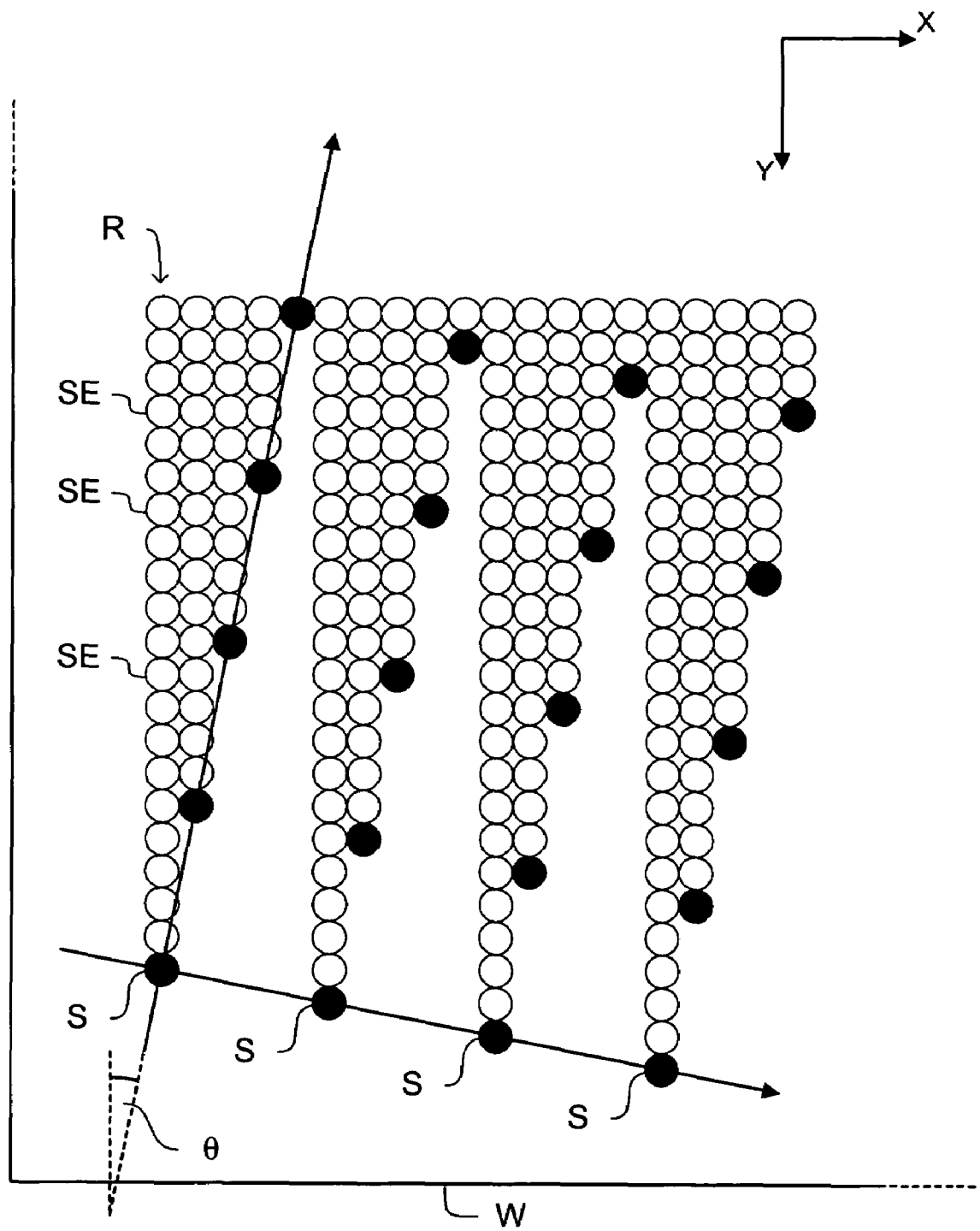
FIG. 3 depicts a mode of transferring a pattern to a substrate using an embodiment of the invention as show in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle θ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. In one example, the angle θ is at most 20°, 10°, e.g., at most 5°, at most 3°, at most 1°, at most 0.5°, at most 0.250, at most 0.10°, at most 0.05°, or at most 0.01°. In one example, the angle θ is at least 0.001°.

Figure 4:
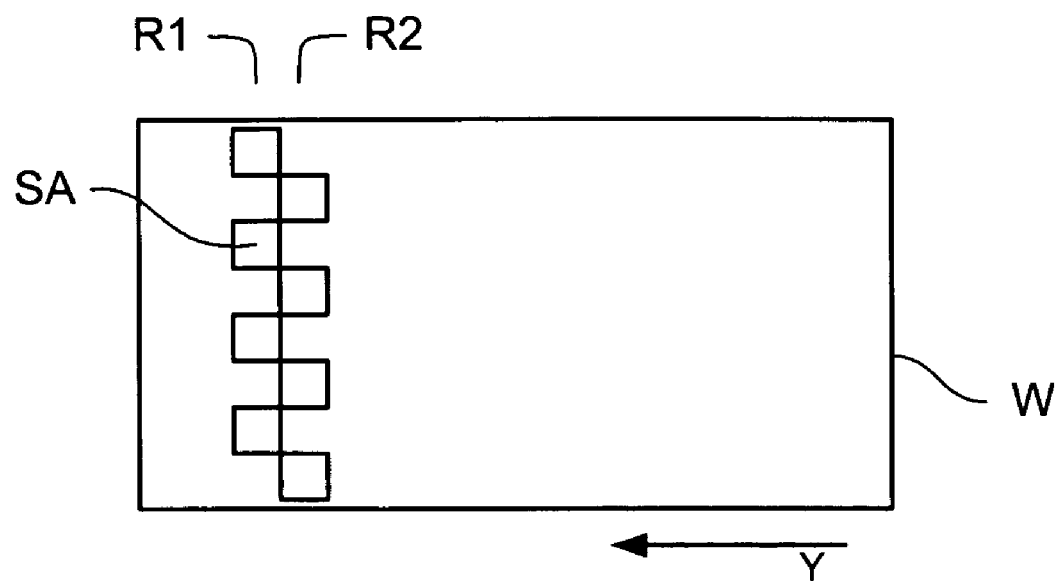
FIG. 4 depicts an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots S slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, e.g., at least 2, at least 4, at least 8, at least 10, at least 12, at least 14, or at least 17. In one example, the number of optical engines is less than 40, e.g., less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

EMBODIMENT 1

FIGS. 5a to 5d and 6a to 6d depict a mode of operation of a radiation beam inspection device, according to one embodiment of the present invention. FIGS. 5a to 5d depict the radiation beam inspection device in cross-section. FIGS. 6a to 6d depict the radiation beam inspection device in plan view in corresponding instances.

Figure 5A:
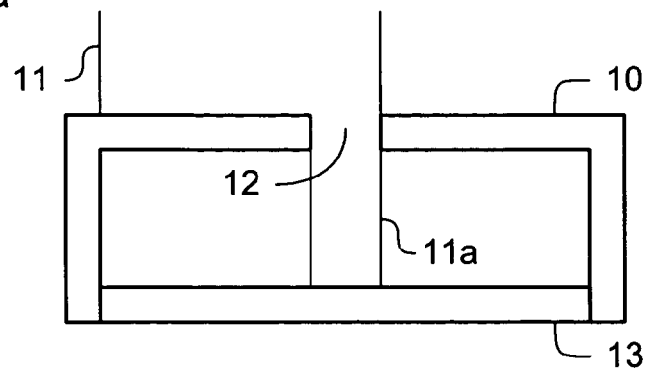
FIGS. 5a, 5b, 5c and 5d depict, in cross-section, a radiation beam inspection device, according to a first embodiment of the present invention.

As shown in FIG. 5a, the radiation beam inspection device comprises a barrier 10 to a beam of radiation 11 the barrier 10 includes an aperture 12 which permits a portion 11a of the beam of radiation 11 to pass through the barrier. The radiation beam inspection device further includes a radiation sensor 13 which detects the intensity of the radiation passing through the aperture 12. Accordingly, it is possible to determine the intensity of the radiation in the portion 11a of the beam of radiation 11 that is incident on the aperture 12.

Figure 5B:
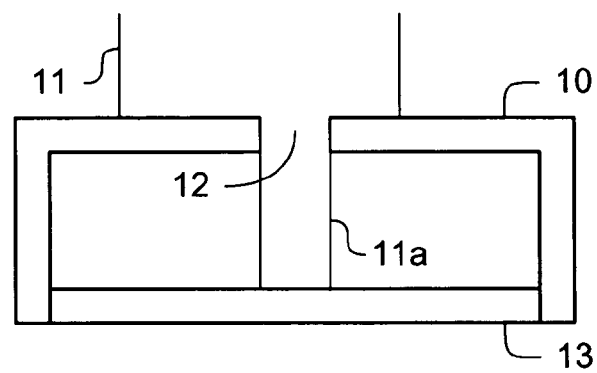
Figure 5C:
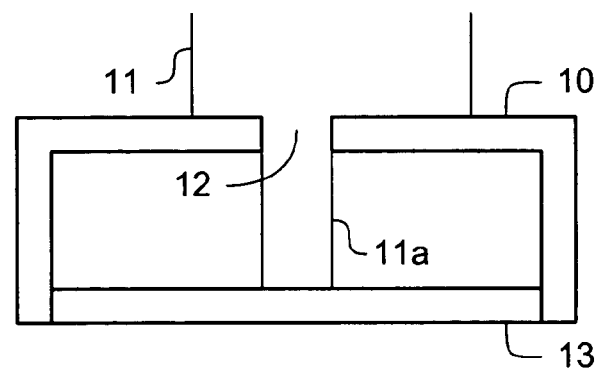
Figure 5D:
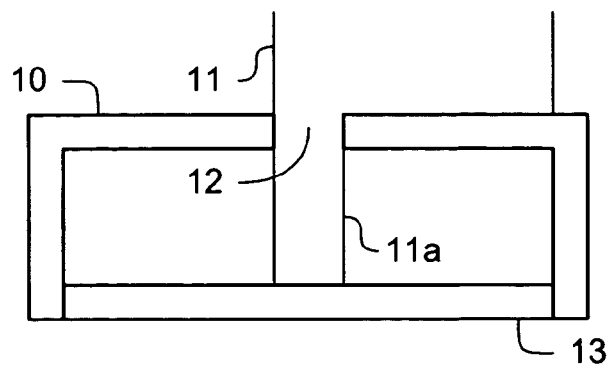
Figure 6A:
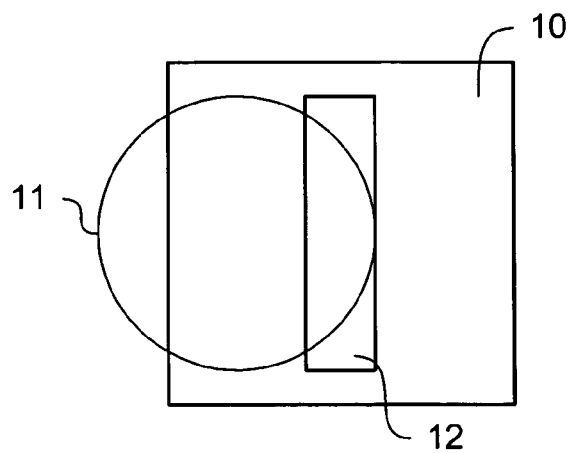
FIGS. 6a, 6b, 6c and 6d depict, in plan view, a radiation beam inspection device, according to the first embodiment of the present invention.
Figure 6B:
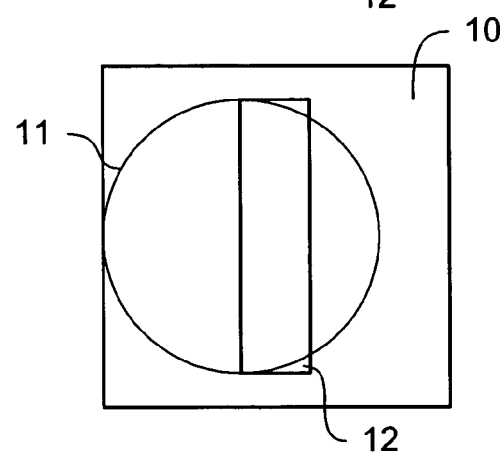
Figure 6C:
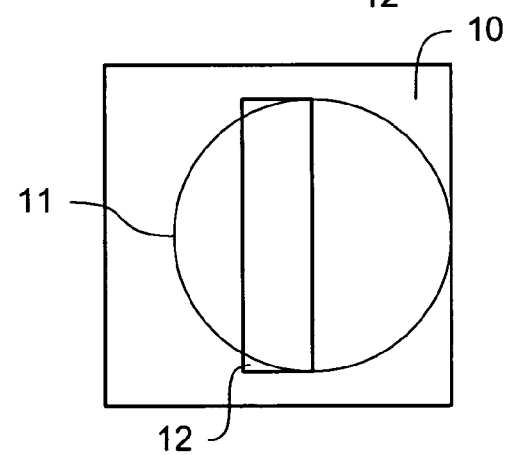
Figure 6D:
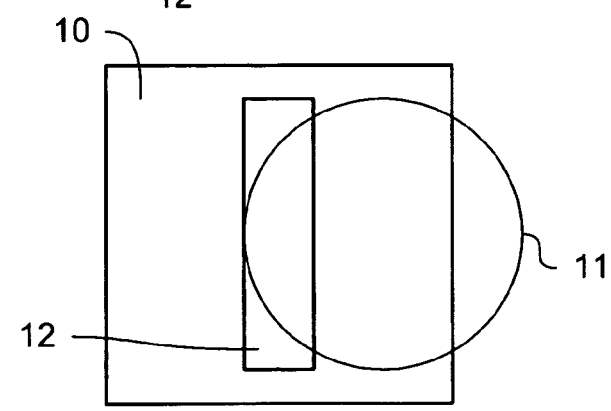

As shown in FIGS. 5b to 5d, the radiation beam inspection device can be moved relative to the beam of radiation 11 such that the aperture 12 intersects with different parts of the cross section of the beam of radiation 11. Accordingly, the radiation sensor 13 detects the intensity of the radiation in the different parts of the cross-section of the beam of radiation 11. Accordingly, a profile of the intensity of the radiation across the beam of radiation 11 can be determined.

As shown in FIG. 6a to 6d, the aperture 12 in the barrier 10 can be an elongate shape (e.g., the size of the aperture 12 in an elongate direction is significantly larger than the size of the barrier in a direction perpendicular to the elongate direction). Accordingly, by moving the aperture 12 relative to the beam of the radiation 11 in a direction perpendicular to the elongate direction of the aperture 12 the beam of radiation 11 can be inspected. By way of example, an aperture can be 0.5 microns wide and 150 microns long. It will be appreciated different sizes and different aspect ratios can be used.

The beam of radiation 11 inspected by the radiation beam inspection device can be the beam of radiation modulated in the lithographic projection apparatus. Alternatively, however, the beam of radiation 11 inspected by the radiation beam inspection device can only be a portion of the beam of radiation modulated by the lithographic apparatus or a region within the cross-section of the beam of radiation modulated by the lithographic apparatus. In one example, in an apparatus in which the projection system has an array of focusing elements that each project a sub-beam of radiation onto a spot onto the substrate, the radiation beam inspection device can be configured to inspect such sub-beams of radiation. Such sub-beams of radiation can have a cross-section of about 1.5 microns in the plane at which it is incident on the barrier. However, the spacing between adjacent sub-beams can be significantly larger. Therefore, for example, the maximum size of the aperture, for example the size along the elongate direction if appropriate, can be smaller than the separation of the sub-beams of radiation within the plane at which the sub-beams of radiation are incident on the barrier 10. Accordingly, radiation beam inspection device can be able to inspect a single sub-beam of radiation. The maximum size of the aperture can, however, be larger than the cross-section of the sub-beams of radiation in the plane at which the sub-beams of radiation are incident on the barrier such that the entirety of a sub-beam of radiation can be inspected in a single pass of the radiation beam inspection device relative to the sub-beam of radiation. It will be appreciated that a plurality of radiation beam inspection devices can be used. Accordingly, for example, more than one of the sub-beams of radiation can be inspected at a time.

In one example, the radiation sensor can be constructed not only to detect the intensity of the radiation passing through the aperture in 12 in the barrier 10 but also to detect the position, relative to the aperture at which the radiation is incident on the radiation sensor 13. This can be used to determine the direction of propagation of the radiation in the radiation beam 11 relative to the barrier of the radiation beam inspection device. Consequently, it is possible to measure the telecentricity of the beam of radiation.

Figure 7:
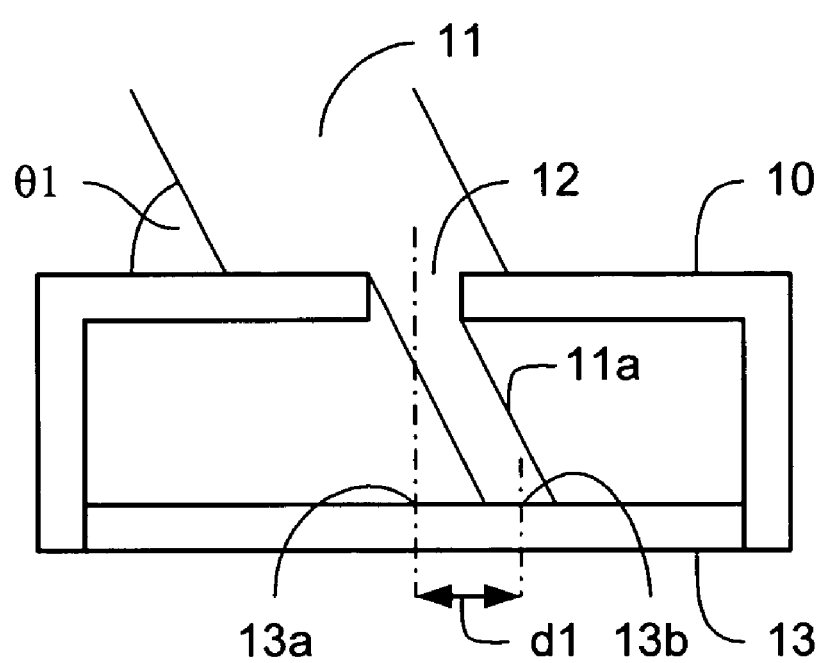
FIG. 7 depicts, in cross-section, a further view of a radiation beam inspection device, according to the first embodiment.

As shown in FIG. 7, a beam of radiation 11 can be incident on the barrier 10 at an angle $\theta_1$ relative to the surface of the barrier 10. Accordingly, the portion 11a of the beam of radiation that passes through the aperture 12 is incident on the radiation sensor 13 at a different point 13b to the point 13a on the radiation sensor that the radiation passing through the aperture 12 would be incident on if the direction of propagation of the radiation beam was perpendicular to the barrier 10. The distance dl between points 13a and 13b is related to the angle $\theta_1$ at which the beam of radiation 11 is incident on the barrier 10 by a simple geometric relationship. Accordingly, once the apparatus has been appropriately calibrated, the radiation sensor 13 can be used to determine the angle at which the beam of radiation is incident on the radiation beam inspection device.

Figure 8:
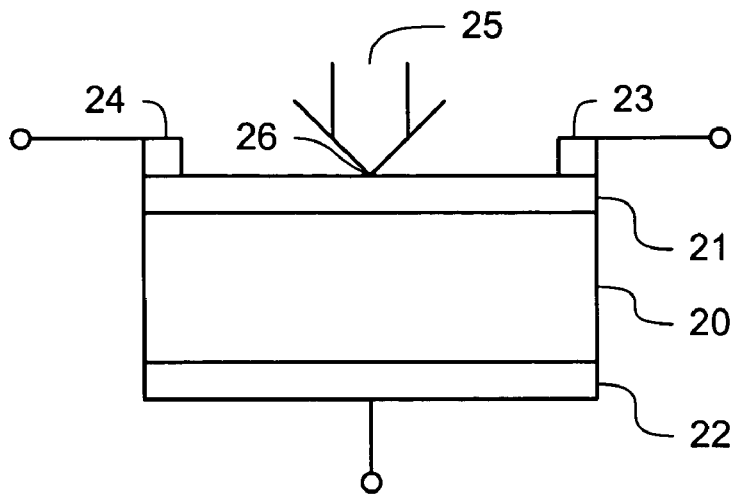
FIG. 8 depicts, in cross-section, a radiation sensor, according to one embodiment of the present invention.

As shown in FIG. 8, a radiation sensor can be a position sensitive diode (PSD), according to one embodiment of the present invention. In one example, a PSD is formed from an I-layer 20 sandwiched between a P-layer 21 and a N-layer 22. Electrodes 23,24 are attached at opposite ends of the P-layer 21. When radiation 25 is incident on the PSD, the radiation is converted photoelectrically and can be detected by the electrodes 23,24. An electric charge proportional to the radiation energy is generated at the position 26 at which the radiation is incident. This electric charge is driven through the resistive P-layer and collected by the electrodes. Since the resistivity of the P-layer is uniform, the photo current collected by each electrode is inversely proportional to the distance between the incident position 26 and the electrode 23,24. Accordingly, the intensity of the radiation incident on the PSD can be determined from the total photocurrents detected at the electrodes 23,24. The position at which the radiation is incident can be determined from the difference between the photocurrents detected at the two electrodes 23,24.

Using a PSD as described above can allow for the rapid determination of the intensity of radiation incident on the sensor and its position in a single dimension. If it is necessary to determine the position of the incident radiation along a second dimension, additional electrodes can be attached to the P-layer (for example, the PSD can be square in shape with one electrode attached to each side). As an alternative, two electrodes, attached at opposite ends of the device along the second dimension, can be attached to the N-layer.

Figure 9:
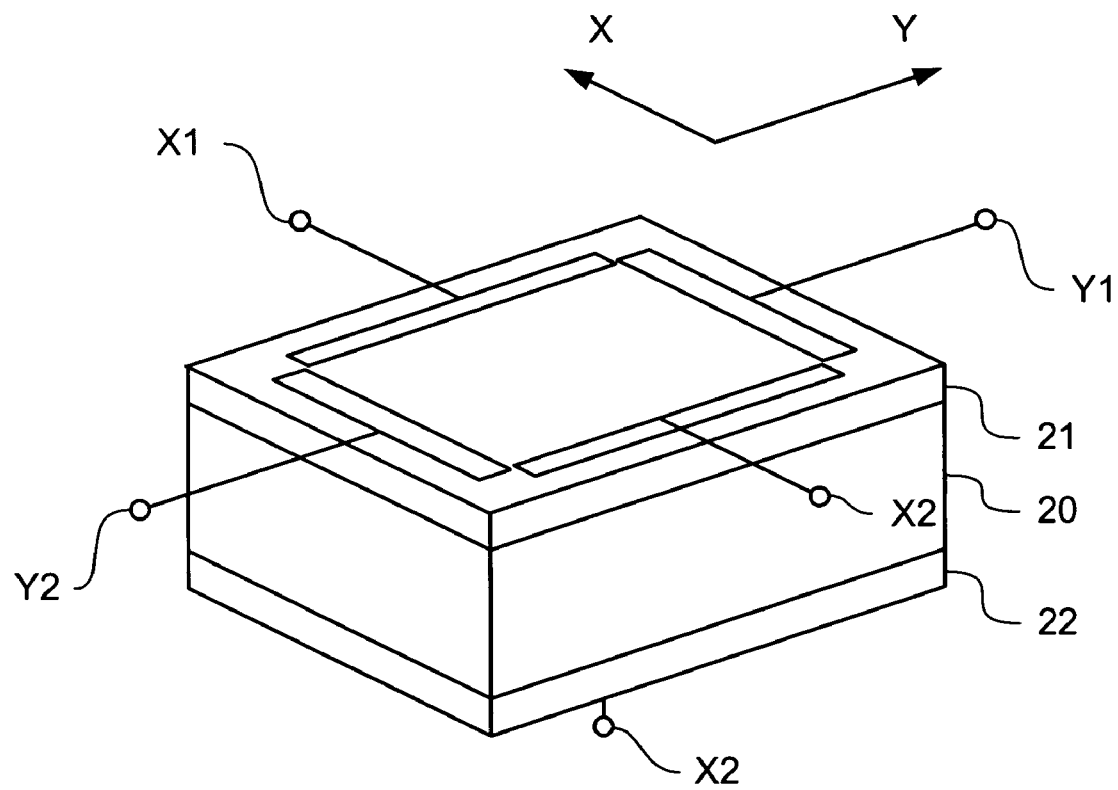
FIG. 9 depicts a radiation sensor, according to one embodiment of the present invention.

FIG. 9 shows a two-dimensional PSD, according to one embodiment of the present invention. As shown, the PSD is comprised of an I-layer 20 sandwiched between a P-layer 21 and a N-layer 22. Electrodes X1, X2, Y1, Y2 are connected to the P-layer and a bias electrode 28 is connected to the N-layer. Two electrodes X1,X2 are attached at opposite sides of the device along the X dimension. The difference in the photocurrent detected at these two electrodes X1 ,X2 can be used to determine the position of the incident radiation along the X dimension. The remaining two electrodes Y1,Y2 are arranged at opposite sides of the device along the Y dimension. The difference in the photocurrent detected at these electrodes Y1,Y2 can be used to determine the position of the incident radiation along the Y dimension (which is orthogonal to the X dimension).

It will be appreciated that the invention is not limited to the use of a PSD device as described above. In particular, it will be appreciated that variations of the PSD device as described above can be used. Furthermore, other suitable devices for detecting the intensity and position of a radiation spot can be used. For example, a CCD or CMOS camera can be used.

EMBODIMENT 2

In the arrangement described above in relation to FIGS. 5a to 5d and 6a to 6d, a radiation beam inspection device having a barrier with an elongate aperture is moved relative to the beam of radiation to be inspected to a plurality of positions in order to determine the intensity profile. However, this can only provide an intensity profile of the beam of radiation in one dimension. It can be desirable to determine the intensity profile of the beam of radiation in two dimensions.

Figure 10A:
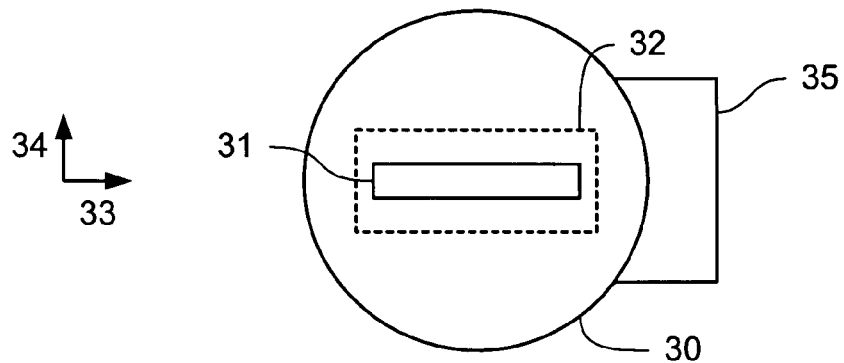
FIGS. 10a and 10b depict a radiation beam inspection device, according to a second embodiment of the present invention.
Figure 10B:
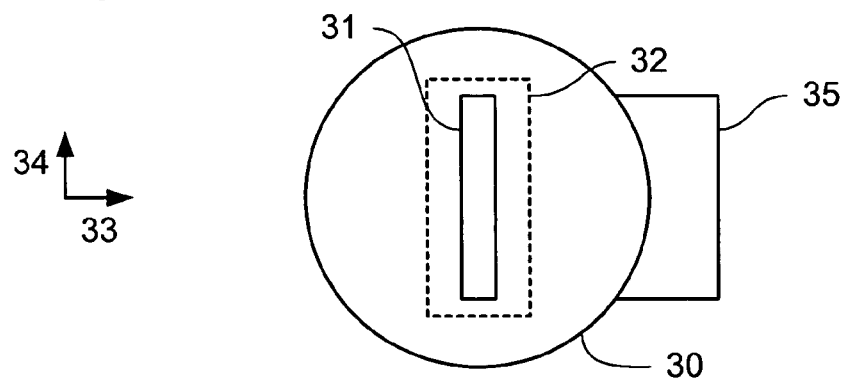

FIGS. 10a and 10b show a radiation beam inspection device allowing for two dimensional intensity profiles, according to one embodiment of the present invention. As shown, the radiation beam inspection device has a barrier to the radiation 30 having an elongate aperture 31. The radiation beam inspection device further includes a radiation sensor 32 such as described above in relation to the first embodiment. As shown in FIG. 10a, the elongate aperture 31 is arranged such that its elongate direction is parallel to a first direction 33. By moving the radiation beam inspection device relative to the beam of radiation being inspected in a second direction 34, perpendicular to the first direction 33, it is possible to determine the radiation intensity profile of the beam of radiation inspected along the second direction.

The radiation beam inspection device according to the second embodiment further includes an actuator 35 which can rotate the barrier 30 and the radiation sensor 32. Accordingly, as shown in FIG. 10b, the barrier 30 and the radiation sensor 32 can be rotated to a second position in which the elongate direction of the aperture 31 is parallel to the second direction 34. Accordingly, in this position the radiation beam inspection device can be moved relative to the beam of radiation being inspected in the second direction enabling the radiation intensity profile of the beam of radiation along the second direction to be determined. Therefore a two dimensional beam intensity profile can be determined.

It will be appreciated that the orientation of the barrier in the first position need not be perpendicular to the orientation of the barrier in the second position. Other, non-parallel, relative angles can be used, from which a two-dimensional beam intensity profile can be determined.

EMBODIMENT 3

Figure 11A:
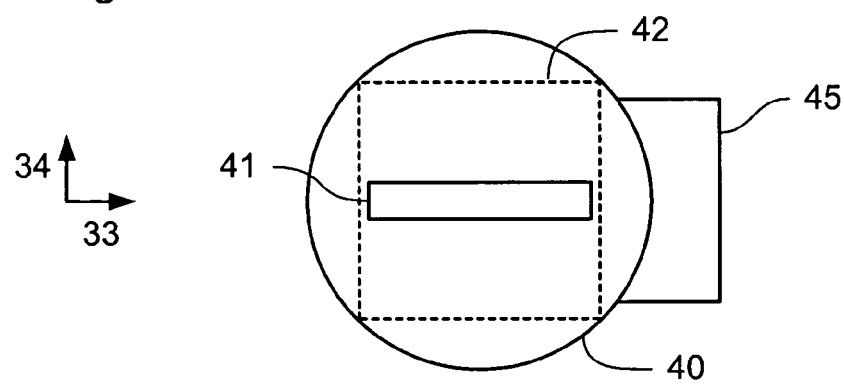
FIGS. 11a and 11b depict a radiation beam inspection device, according to a third embodiment of the present invention.
Figure 11B:
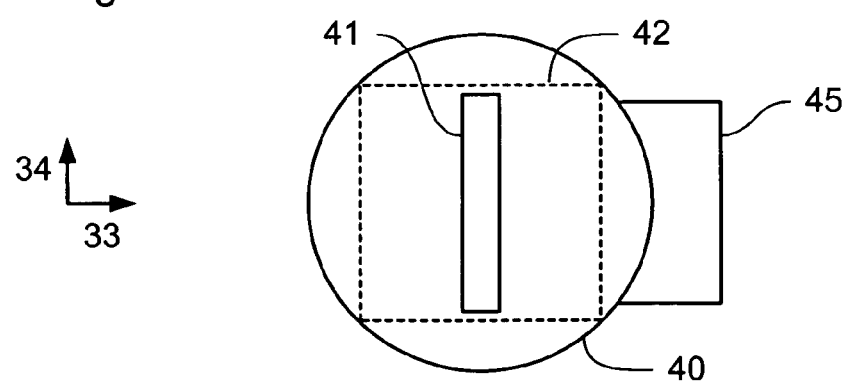

An alternative to the second embodiment is shown in FIGS. 11a and 11b. As with the second embodiment, the radiation beam inspection device includes a barrier 40 to the radiation having an elongate aperture 41, and a radiation sensor 42. The radiation beam inspection device further includes an actuator 45. However, unlike in the arrangement of the second embodiment, the actuator of the third embodiment does not rotate the radiation sensor. The actuator 45 rotates that barrier 40 relative to the radiation sensor 42, such that the barrier can be in the first position shown in FIG. 11a or the second position shown in FIG. 11b, in which the elongate direction of the aperture 41 is parallel to the first direction 33 and the second direction 34, respectively. Accordingly, as with the second embodiment, it is possible to determine a two dimensional radiation intensity profile of the beam of radiation being inspected. It will be appreciated that if a PSD is used as the radiation sensor for the third embodiment, for example, then a two dimensional PSD, such as is described above, can be used.

As with the second embodiment, the orientation of the aperture in the first position need not be perpendicular to the orientation of the aperture in second position.

EMBODIMENT 4

Figure 12:
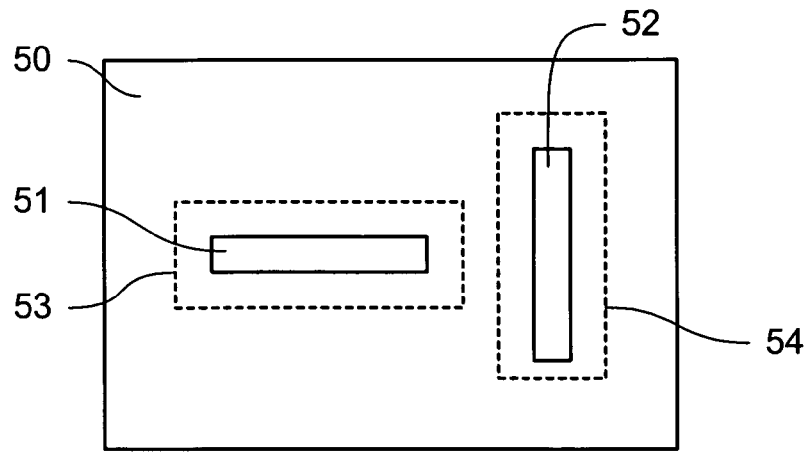
FIG. 12 depicts a radiation beam inspection device, according to a fourth embodiment of the present invention.

FIG. 12 depicts an alternative arrangement of the radiation beam inspection device, according to a further embodiment of the present invention. As shown, the radiation beam inspection device has a barrier 50 to the radiation, which has two apertures 51,52. Both apertures 51,52 have elongate shapes. The elongate direction of the first aperture 51 is perpendicular to the elongate direction of the second aperture 52. A first radiation sensor 53, such as those discussed above in relation to the preceding embodiments, is used in conjunction with the first aperture 51. A second radiation sensor 54, also such as discussed in relation to the preceding embodiments, is used in conjunction with the second aperture 52. Accordingly, in a manner corresponding to that described above, the first aperture 51 and the first radiation sensor 53 can be used to determine the radiation intensity profile of the beam of radiation being inspected in a dimension (perpendicular to the elongate direction of the first aperture 51) and the second aperture 52 and the second radiation sensor 54 can be used to determine the radiation intensity profile of the beam of radiation being inspected along a second direction (perpendicular to the first dimension and therefore the elongate direction of the second aperture 52).

It will be appreciated that, in a manner corresponding to the second and third embodiments, the elongate directions of the first and second apertures need not be perpendicular.

EMBODIMENT 5

Figure 13A:
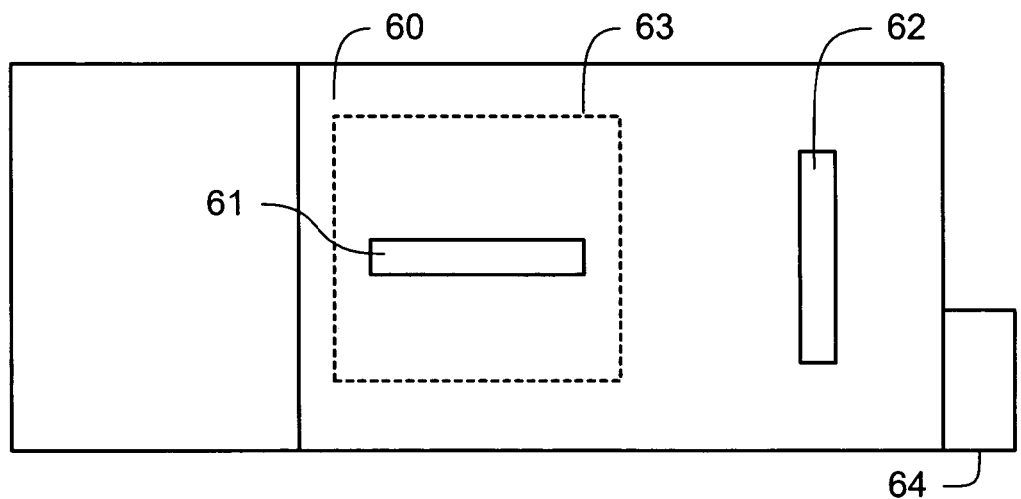
FIGS. 13a and 13b depicts a radiation beam inspection device, according to a fifth embodiment of the present invention.
Figure 13B:
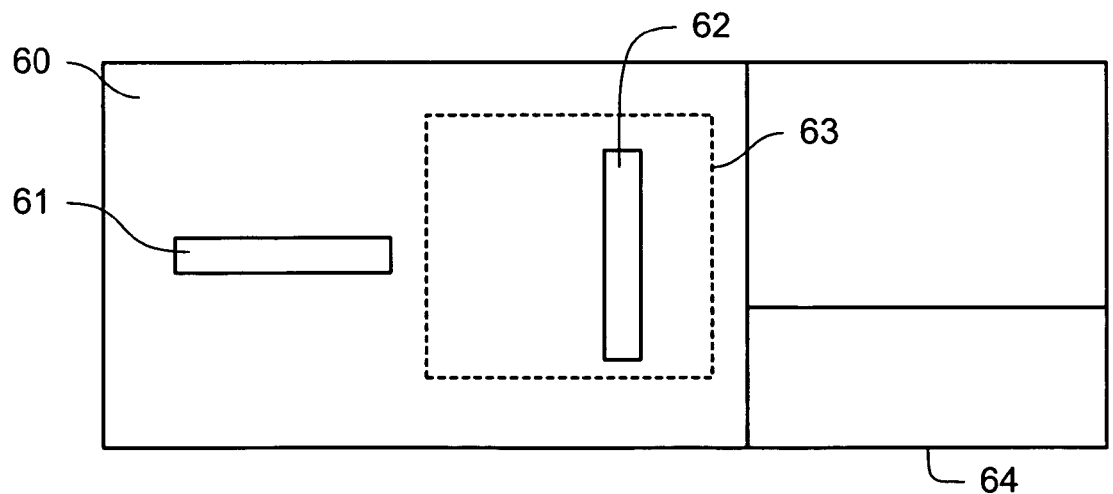

FIGS. 13a and 13b depict an arrangement of a radiation beam inspection device, according to a fifth embodiment of the present invention. As in the fourth embodiment, the radiation beam inspection device comprises a barrier 60 to the radiation having a first aperture 61 and a second aperture 62. Both apertures have elongate shapes arranged such that the elongate direction of the first aperture 61 is perpendicular to the elongate direction of the second aperture 62. It will be appreciated, however, that the apertures need not be mutually perpendicular. A single radiation sensor 63 is provided. An actuator 64 is also provided and constructed to move the radiation barrier 60 between a first position shown in FIG. 13a, in which the radiation passing through the first aperture 61 is incident on the radiation sensor and a second position, shown in FIG. 13b, in which the radiation passing through the second aperture 62 is incident on the radiation sensor 63. Accordingly, when the barrier 60 is in the first position, the first aperture 61 and the radiation sensor 63 can be used to determine the radiation intensity profile of the beam of radiation being inspected along a first dimension (perpendicular to the elongate direction of the first aperture 61). Likewise, when the barrier 60 is in the second position, the second aperture 62 and the radiation sensor 63 can be used to determine the radiation intensity profile of the beam of radiation being inspected along a second dimension (perpendicular to the first dimension and therefore the elongate direction of the second aperture). Accordingly, a two dimensional radiation intensity profile can be determined for the beam of radiation being inspected. It will be appreciated that if the radiation sensor 63 is a PSD as discussed above, a two dimensional PSD can be used.

EMBODIMENT 6

Figure 14:
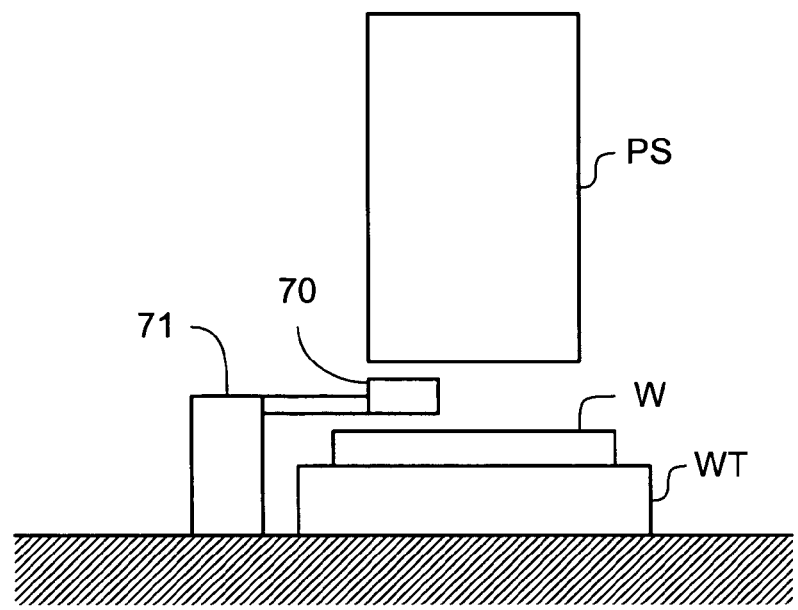
FIG. 14 depicts an arrangement of a portion of a lithographic apparatus, according to a sixth embodiment of the present invention.

FIG. 14 depicts an arrangement of a portion of lithographic apparatus, according to one embodiment of the present invention. It will be appreciated that this arrangement can be used in conjunction with any one of the radiation beam inspection devices discussed above. It will further be appreciated that the radiation beam inspection device can be used to inspect different parts of the beam of radiation used in the lithographic apparatus. Accordingly, as shown in FIG. 14, the radiation beam inspection device 70 can be mounted on an independent actuator system constructed such that the radiation beam inspection device 70 can be moved to any desired position necessary to inspect the beam of radiation. For example, the actuator system 71 can be constructed to move the radiation beam inspection device to any part of the cross-section of the beam of radiation. It can also be able to move the radiation beam inspection device entirely clear of the beam of radiation, namely to a location at which no part of the beam of radiation is incident on the radiation beam inspection device, in order to avoid interfering with the exposure of a substrate.

It will be appreciated that although FIG. 14 depicts the radiation beam inspection device as being between the projection system PS and the substrate W, due to space restraints, it can be necessary to move the substrate table WT and the substrate W from their normal operating positions in order to enable the radiation beam inspection device 70 to inspect the beam of radiation.

Furthermore, although FIG. 14 depicts the radiation beam inspection device being used to inpsect the beam of radiation projected onto the substrate, it will be appreciated that it can be used to inspect the beam of radiation at any stage in the apparatus. For example, a radiation beam inspection device can be mounted within the projection system and used to provide feedback control to adaptive optics in order to minimize any errors introduced by the projection system.

EMBODIMENT 7

Figure 15:
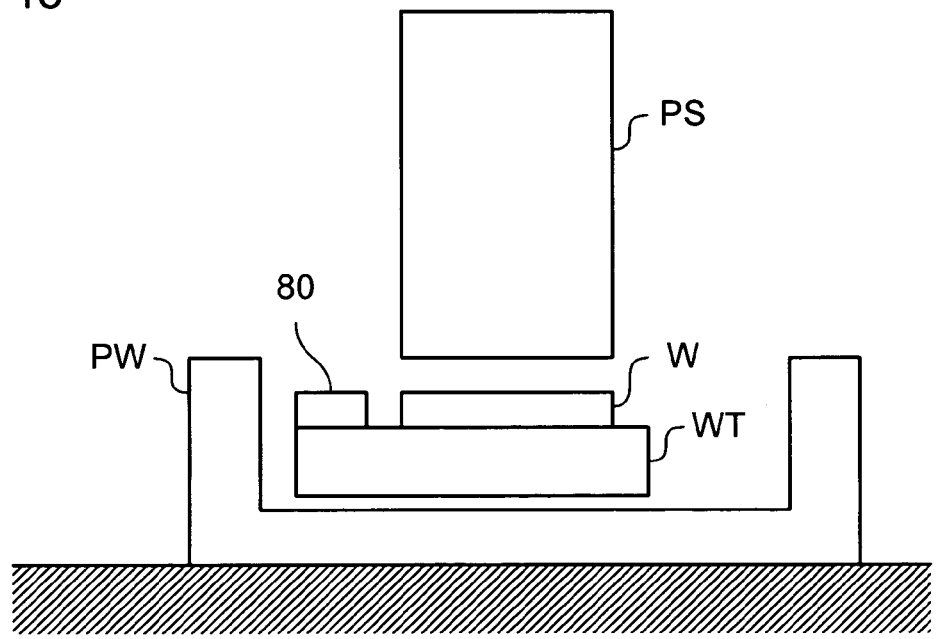
FIG. 15 depicts an arrangement of a portion of a lithographic apparatus, according to a seventh embodiment of the present invention.

FIG. 15 depicts an alternative arrangement to that described in the sixth embodiment, according to the present invention. In this arrangement, the substrate W can be held in a fixed position relative to the substrate table WT. Accordingly, the substrate table WT is provided with a positioner PW, which is constructed to move the substrate table WT, and therefore the substrate W relative to the projection system PS in order expose the desired pattern at the desired location on the substrate. In such an apparatus, the radiation beam inspection device 80 can be mounted on the substrate table WT, such that the radiation beam inspection device 80 can be moved to inspect the desired portion of the beam of radiation by moving the substrate table WT using the positioner PW. Accordingly, a separate actuator system is not required.

The radiation beam inspection device 80 can, as shown as in FIG. 15, be mounted on the substrate table WT adjacent to the position of the substrate W when it is fixed to the substrate table WT. Accordingly, the beam of radiation can be inspected by the radiation beam inspection device at any time. As an alternative, the radiation beam inspection device can be mounted to the substrate table WT beneath the substrate W. Accordingly, the radiation beam inspection device can only be used to inspect the radiation beam when no substrate W is held on the substrate table WT. When a substrate W is held on the substrate table WT, the substrate W is between the projection system PS and the radiation beam inspection device 80, preventing operation of the radiation beam inspection device. However, the substrate table WT of this variant can be smaller than that of the arrangement shown in FIG. 15.

EMBODIMENT 8

Figure 16A:
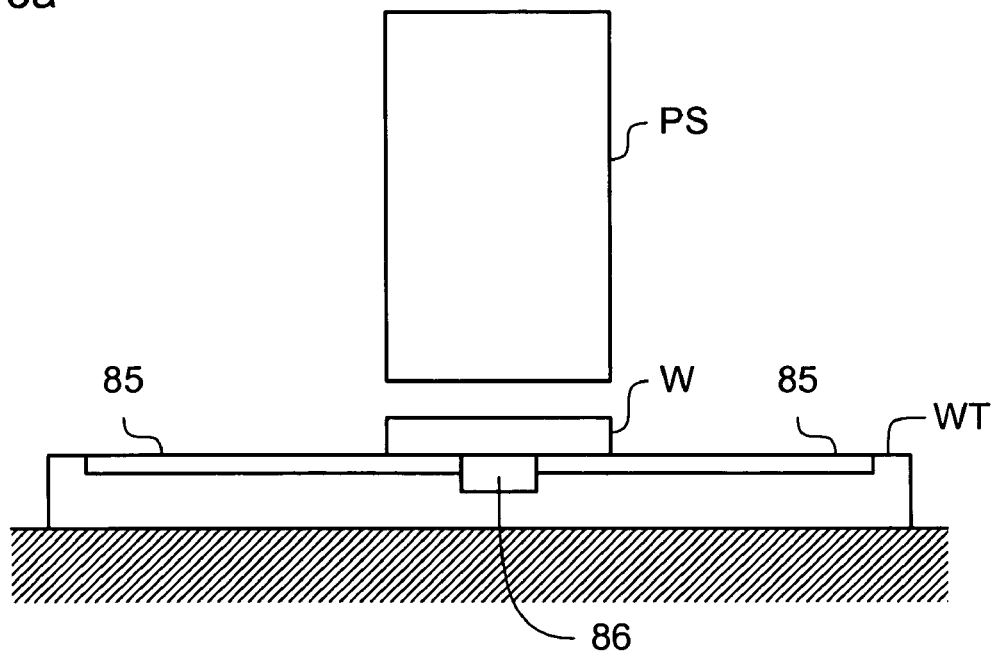
FIGS. 16a and 16b depict an arrangement of a portion of a lithographic, apparatus according to an eighth embodiment of the present invention.
Figure 16B:
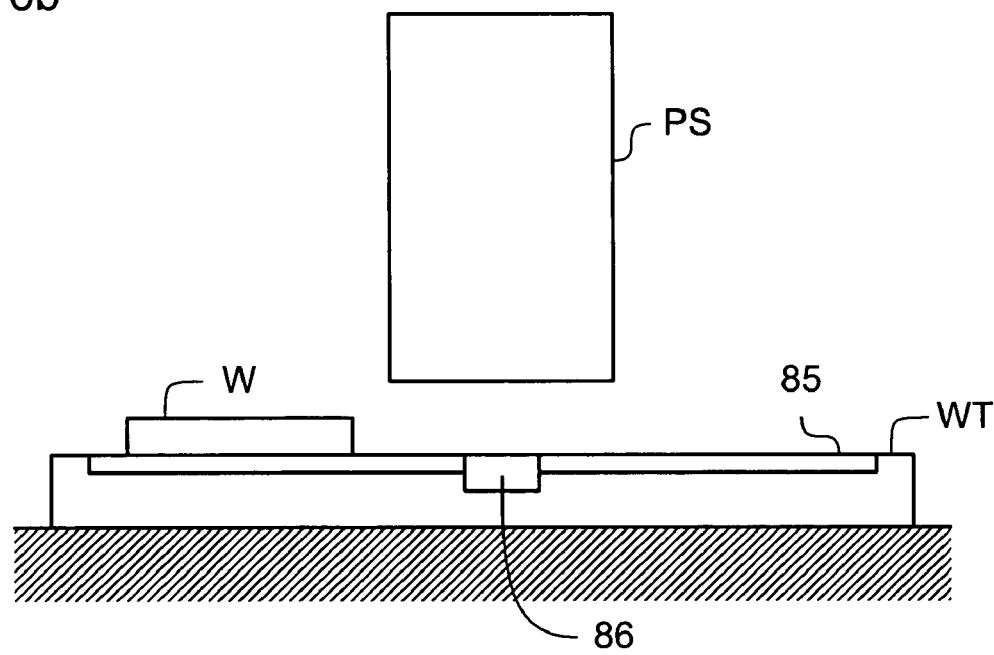

FIGS. 16a and 16b depict an alternative arrangement to that described above in relation to the sixth and seventh embodiments, according to the present invention. As shown in FIGS. 16a and 16b, in this embodiment the substrate table WT is constructed to support the substrate W, but not hold it in a fixed position. The substrate table WT is provided with an actuator system 85 that advances the substrate W across the substrate table WT. In one example, the substrate W can be moved from a first position, in which the substrate W is loaded to the substrate WT, to a second position, in which a modulated beam of radiation is projected onto the substrate W by the projection system PS. Subsequently, the substrate can be moved to a third position, in which the substrate W can be removed from the substrate table WT.

In one arrangement, the lithographic apparatus can be constructed such that the entire substrate W can be exposed with the modulated beam of radiation in a single pass of the substrate relative to the projection system PS. Accordingly, the actuator system 85 can be constructed to move the substrate W at a constant speed across the substrate table WT, for example from the first to the third position described above. In such an arrangement, the radiation beam inspection device 86 can be set within the substrate table WT, such that the substrate W can pass across it without interference.

As shown in FIG. 16a, when the substrate is in a position to be exposed by the projection system PS, the substrate W is between the projection system PS and the radiation beam inspection device 86, preventing use of the radiation beam inspection device. However, as shown in FIG. 16b, when a substrate W is not in a position to be exposed by a beam of radiation projected by the projection system PS, the radiation beam inspection device 86 can inspect the beam of radiation. Therefore, the beam of radiation projected by the projection system PS, or a part thereof, can be inspected, for example, between the exposure of a first substrate and the exposure of a second substrate.

It will be appreciated that the radiation beam inspection device 86 can be mounted to the substrate table WT by means of an actuator system, such that the radiation beam inspection device can be moved to inspect different parts of the beam of radiation.

EMBODIMENT 9

Figure 17A:
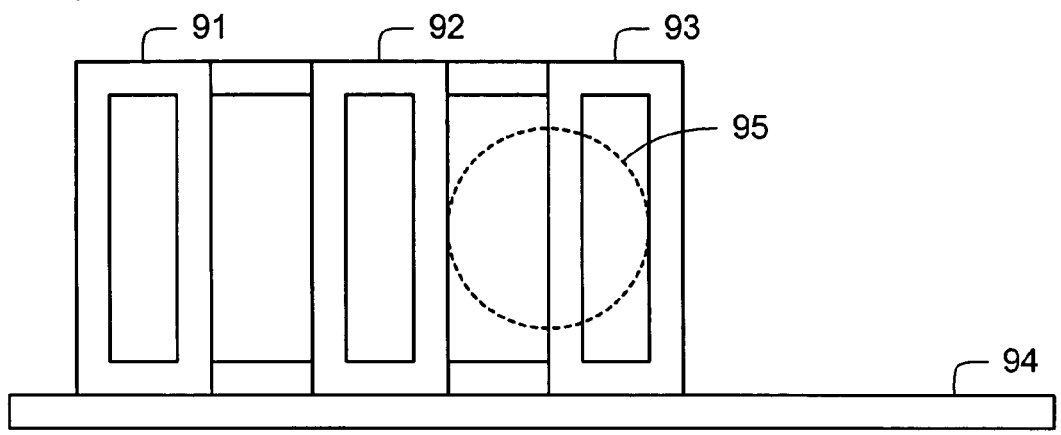
FIGS. 17a to 17c depict an arrangement of radiation beam inspection devices, according to a ninth embodiment of the present invention.
Figure 17B:
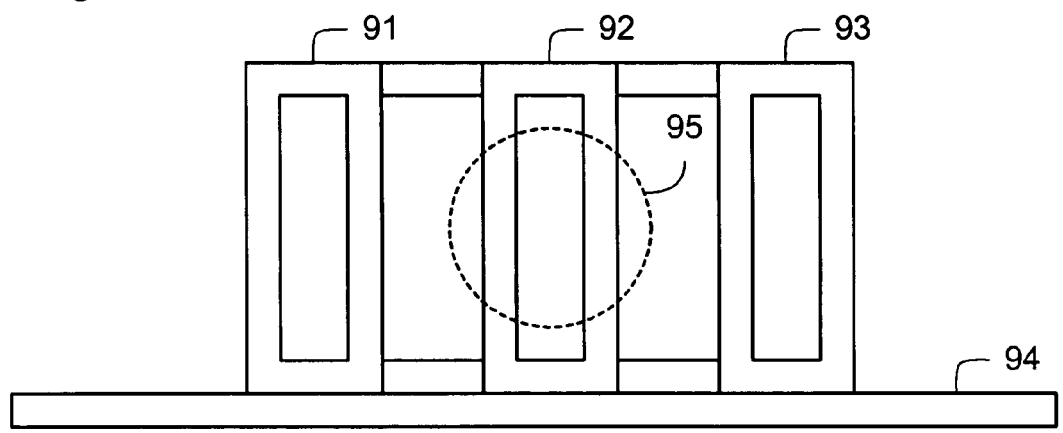
Figure 17C:
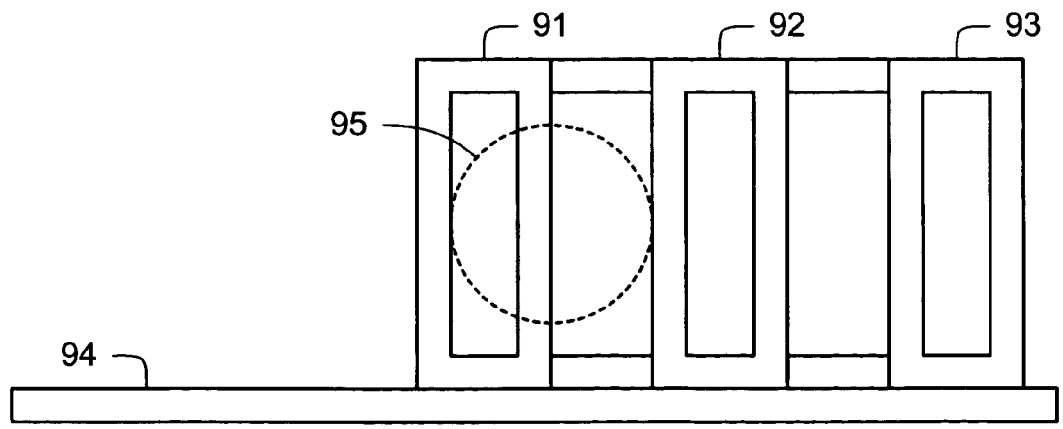

FIGS. 17a to 17c depict a further embodiment of the present invention, which can be used in conjunction with any one of the embodiments described above. As described above, a single radiation beam inspection device can be used to inspect different parts of a beam of radiation or different parts of a given region of a beam of radiation (e.g., a sub-beam of radiation, corresponding to the portion of a beam of radiation that is projected onto a substrate by a focusing element in an array of focusing elements). However, a plurality of radiation beam inspection devices can be used together in order to inspect the beam of radiation or the requisite portion thereof. FIG. 17a depicts such an arrangement. First, second, and third radiation beam inspection devices 91,92,93 are connected together with a fixed separation between them. It will be appreciated that this can be formed as a single unit. An actuator system 94 is provided to move the set of radiation beam inspection devices relative to the beam of radiation 95 to be inspected. As shown in FIGS. 17a, 17b and 17c, the set of radiation beam inspection devices 91,92,93 can be moved by the actuator system 94, such that in a first position (shown in FIG. 17a) one of the radiation beam inspection devices 93 inspects a first portion of the beam of radiation 95, in a second position (shown in FIG. 17b) a different radiation beam inspection device 92 inspects a different portion of the beam of radiation 95, and in a third position (shown in FIG. 17c) the final radiation beam inspection device 91 inspects yet another portion of the beam of radiation 95. It will be appreciated that the invention is not limited to the use of three radiation beam inspection devices as shown in FIGS. 17a to 17c. By appropriate selection of the number of radiation beam inspection devices to be fixed together in a set and the size of their respective apertures, the apparatus can be configured such that each part of the beam of radiation to be inspected, or a desired part thereof, can be inspected by one of the radiation beam inspection devices.

In a lithographic apparatus that utilizes a pulsed beam of radiation, the set of radiation beam inspection devices can be moved between the pulses of the radiation beam such that at successive pulses the set of radiation beam inspection devices is successfully positioned to inspect different parts of the beam of radiation using different radiation beam inspection devices. This can be achieved by scanning the set of radiation beam inspection devices at a constant speed if the separation of the radiation beam inspection devices 91,92,93 and the scan speed of the set of radiation beam inspection devices is appropriately selected for the pulse rate of the radiation beam. For example, in the arrangement shown in FIGS. 17a, 17b and 17c, the actuator system 94 can move the set of radiation beam inspection devices 91,92,93 at a constant speed. In this case, the three Figures represent the position of the set of radiation beam inspection devices 91,92,93 at three successive pulses of the radiation beam 95.

EMBODIMENT 10

Figure 18:
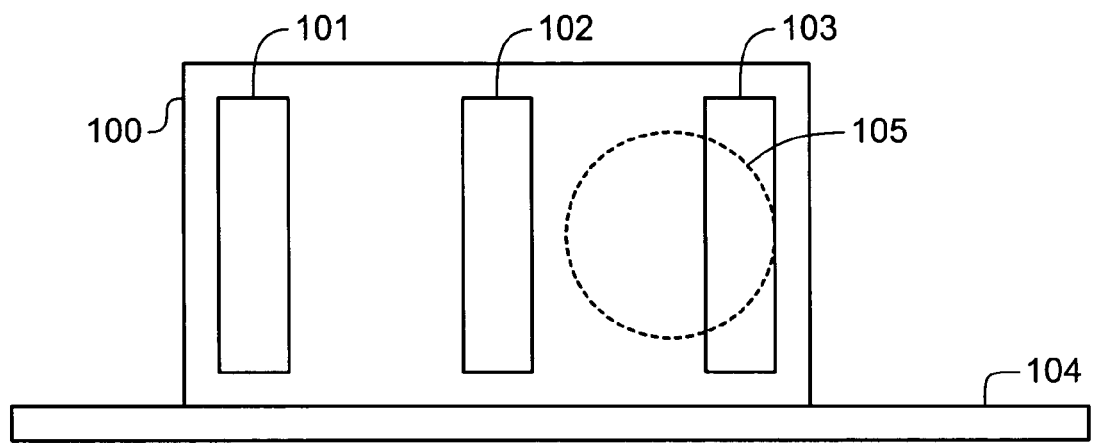
FIG. 18 depicts a radiation beam inspection device, according to a tenth embodiment of the present invention.

FIG. 18 depicts a variant of the embodiment depicted in FIGS. 17a to 17c, according to another embodiment of the present invention. In this arrangement, a single radiation beam inspection device 100 is used to inspect a beam of radiation 105, or part thereof. As shown, the radiation beam inspection device 100 has a plurality of apertures 101,102, 103 that perform a function corresponding to that of the individual radiation beam inspection devices of the ninth embodiment. In the same way as described above in relation to the fourth and fifth embodiments, the radiation beam inspection device can include separate radiation sensors that are used in conjunction with each of the apertures 101,102, 103. As an alternative, a single radiation sensor can be provided. Likewise, if a single radiation sensor is used, this can be sufficiently large that radiation passing through any of the apertures can be detected by the radiation sensor without moving the radiation sensor relative to the apertures.

As an alternative, the radiation sensor can only be sufficiently large to detect the radiation passing through a single aperture. In such an arrangement, the radiation sensor can be held in a fixed position relative to the beam of radiation and the actuator system 104 can move the barrier of the radiation beam inspection device 100 such that each of the apertures 101,102,103 is successively positioned to inspect the desired part of the beam of radiation 105. It will be appreciated that, as with the ninth embodiment, by appropriate selection of the spacing of the apertures and constant scan speed of the radiation beam inspection device 100 (or the barrier thereof as appropriate), the radiation beam inspection device 100 can be configured to inspect different parts of the beam of radiation 105 during successive pulses of a pulsed beam of radiation.

Figure 19:
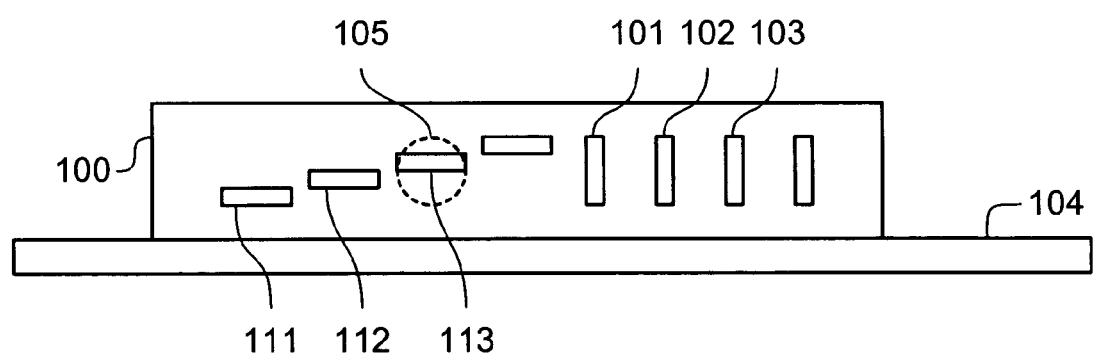
FIG. 19 depicts a variation of the radiation beam inspection device of the tenth embodiment.

FIG. 19 depicts a variation of the radiation beam inspection device of the tenth embodiment, according to a further embodiment of the present invention. As shown in FIG. 19, the radiation beam inspection device 100 can include apertures having an elongate shape arranged such that a first plurality of apertures 101,102,103 are arranged with their elongate direction parallel to a first direction and a second plurality of apertures 111,112,113 are arranged such that their elongate direction is parallel to a second direction, orthogonal to the first direction. Successively using the first group of apertures 101,102,103 and the second group of apertures 111,112,113 to inspect a beam of radiation 105 or a portion thereof enables a two dimensional radiation intensity profile for the beam of radiation to be determined, as discussed above in relation to the second to fifth embodiments. For example, such a radiation beam inspection device (or barrier thereof as appropriate), can be moved in a direction parallel to the second direction such that each successive aperture inspects a portion of the beam of radiation.

Figure 20:
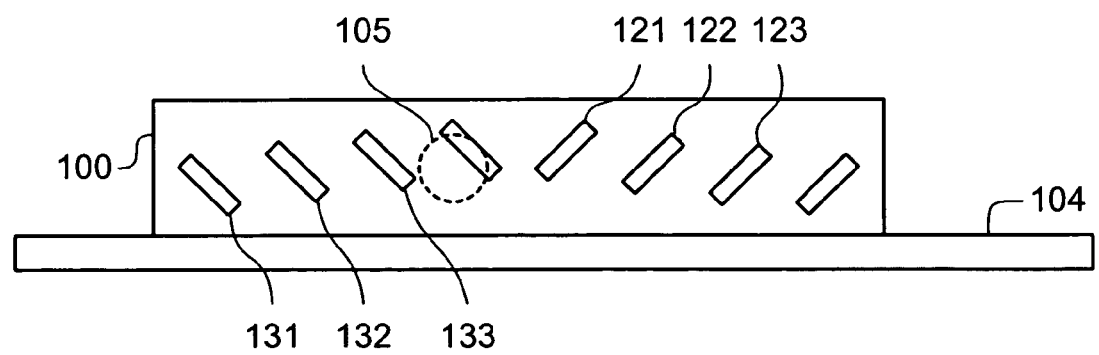
FIG. 20 depicts a further variation of the radiation beam inspection device of the tenth embodiment.

FIG. 20 shows a further variation of FIGS. 18 and 19, according to one embodiment of the present invention. In FIG. 20, a first group of apertures 121,122,123 are arranged such that their elongate directions are mutually parallel but arranged at an oblique angle, for example about 45°, to the direction in which the radiation beam inspection device (or barrier thereof as appropriate) is moved relative to the beam of radiation. A second group of apertures 131,132,133 is arranged such that their elongate directions are perpendicular to those of the first group of apertures 121,122,123. Accordingly, a two-dimensional radiation intensity profile of the radiation inspected can be generated. However, an arrangement such as that shown in FIG. 20 is less sensitive, compared to the arrangement shown in FIG. 19, to errors in synchronization of the pulses of the radiation beam with the movement of the radiation beam inspection device (or barrier thereof as appropriate) and errors in the position of the radiation beam inspection device (or barrier thereof) in a direction perpendicular to the direction in which it is moved.

As discussed above, the embodiments of the present invention can be used to inspect a beam of radiation or a part thereof. This can enable the determination of a radiation intensity profile and the telecentricity of the beam of radiation or relevant part thereof. It will be appreciated that this information can be used to adjust one or more settings of a lithographic apparatus. For example, one or more inspections of a beam of radiation, or part thereof, can be performed prior to use of the lithographic apparatus in order to provide the requisite settings before the lithographic apparatus is used. As an alternative, one or more inspections of the beam of radiation, or part thereof, can be performed between exposures of successive substrates or part-way through exposures of individual substrates in order to update the settings of the lithographic apparatus and/or to validate that the apparatus is performing correctly.

In an apparatus utilizing an array of focusing elements in the projection system to project individual portions of the beam of radiation onto the substrate as an array of the sub-beams of radiation to form an array of spots, there can be, as described above, many thousands of such sub-beams of radiation. Radiation beam inspection devices can be provided to inspect each sub-beam of radiation individually. It can therefore take a significant amount of time to inspect each sub-beam of radiation one by one. The lithographic apparatus can therefore be provided with a plurality of radiation beam inspection devices (or, if appropriate, sets thereof) such that a plurality of sub-beams of radiation can be simultaneously inspected.

In the case of apparatus such as described above in relation to the ninth and tenth embodiments in which a plurality of radiation beam inspection devices within a set or a plurality of apertures within one radiation beam inspection device are used successively to inspect different parts of a beam of radiation, the apparatus can be constructed such that while a first radiation beam inspection device of a given set (or a first aperture of a given radiation beam inspection device) is inspecting a first part of one sub-beam of radiation, another radiation beam inspection device of that set (or another aperture of that radiation beam inspection device, as appropriate) is inspecting a portion of a different sub-beam of radiation. It will be appreciated that such a scheme could be expanded such that a single set of radiation beam inspection devices (or radiation beam inspection device having a plurality of apertures) can be inspecting any number of sub-beams of radiation at a given instant.

Even with such schemes as described above, inspecting all of the sub-beams of radiation can take a considerable amount of time. Accordingly, after the lithographic apparatus has been initially set up, in which a relatively greater amount of time can be taken to inspect each of the sub-beams of radiation, only a portion of the sub-beams of radiation can be inspected at a given time. For example, between exposures of successive substrates, a given portion of the sub-beam of radiation can be inspected. Any changes detected in the inspected sub-beams of radiation can be indicative of changes to all of the sub-beams of radiation and, accordingly, it can be possible to compensate for changes that are expected to have occurred to the sub-beams of radiation that are not inspected. Alternatively or additionally, the portion of the sub-beams of radiation that are inspected between exposures of successive substrates can be rotated such that after a given number of substrates have been exposed, all of the sub-beams of radiation will have been inspected.

It will also be appreciated that the sub-beams of radiation can be inspected at times other than between exposures of successive substrates. For example, the sub-beams of radiation can be inspected during any down-time of the lithographic apparatus.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), etc. Also, for instance in a flat panel display, the present apparatus can be used to assist in the creation of a variety of layers, e.g., a thin film transistor layer and/or a color filter layer.

Although specific reference can have been made above to the use of embodiments of the invention in the context of optical lithography, it will be appreciated that the invention can be used in other applications, for example imprint lithography, where the context allows, and is not limited to optical lithography. In imprint lithography topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A lithographic projection apparatus, comprising:
   a patterning device that modulates a beam of radiation;
   a projection system that is configured to produce an array of sub-beams of the modulated beam of radiation and to project the array of sub-beams of the modulated beam onto a target portion of a substrate; and
   a radiation beam inspection device that comprises,
      a barrier to the radiation beam having an aperture that permits a portion of the radiation beam to pass through the barrier, wherein a size of a largest dimension of the aperture is smaller than a separation between adjacent ones of the sub-beams of radiation in a plane at which the array of sub-beams are incident on the barrier, and
      a radiation sensor that detects intensity of the radiation passing through the aperture and a position, relative to the aperture, at which the radiation passing through the aperture is incident on the radiation sensor.

2. The lithographic projection apparatus of claim 1, further comprising:
   an actuator constructed to move at least the barrier of the radiation inspection device relative to the beam of radiation, such that the aperture intersects the beam of radiation at a plurality of different locations within a cross-section of the beam.

3. The lithographic projection apparatus of claim 1, wherein the projection system comprises:
   an array of focusing elements that is configured to produce the array of sub-beams of radiation, wherein each respective one of the focusing elements project a portion of the modulated beam of radiation onto the substrate.

4. The lithographic projection apparatus of claim 1, wherein the size of the largest dimension of the aperture is larger than a width of one of the array of sub-beams of radiation in the plane at which the array of sub-beams are incident on the barrier.

5. The lithographic projection apparatus of claim 1, wherein the aperture has an elongate shape.

6. The lithographic projection apparatus of claim 5, further comprising an actuator that rotates at least the barrier of the radiation inspection device relative to the projection system.

7. The lithographic projection apparatus of claim 5, wherein the lithographic apparatus comprises two radiation beam inspection devices, which are arranged such that the elongate directions of their apertures are not parallel to each other.

8. The lithographic projection apparatus of claim 7, wherein the radiation beam inspective devices are arranged such that the elongate direction of the apertures are perpendicular with respect to each other.

9. The lithographic projection apparatus of claim 1, further comprising:
a substrate table that supports the substrate, wherein the radiation beam inspection device is mounted to the substrate table.

10. The lithographic projection apparatus of claim 9, further comprising:
a substrate table actuator that moves the substrate table relative to the projection system, wherein the substrate table holds the substrate in a fixed position relative to the substrate table.

11. The lithographic projection apparatus of claim 10, wherein the radiation beam inspection device is mounted adjacent to the fixed position of the substrate.

12. The lithographic projection apparatus of claim 9, wherein: the radiation beam inspection device is mounted to the substrate table such that, during exposure of the substrate, the substrate is located between the projection system and the radiation beam inspection device, and such that the radiation beam inspection device inspects at least a part of the beam of radiation when no substrate is located in a position to be exposed.

13. The lithographic projection apparatus of claim 12, wherein the substrate table comprises:
a substrate actuator that moves the substrate relative to the substrate table during a sequence of exposures of the substrate.

14. The lithographic projection apparatus of claim 1, further comprising:
a plurality of the radiation beam inspection devices arranged in fixed positions relative to each other; and
an actuator that moves the radiation beam inspection devices at a constant velocity relative to the projection system, such that the radiation beam is pulsed;
wherein the spacing of the radiation beam inspection devices, the velocity of the radiation beam inspection devices relative to the projection system, and the pulse rate of the beam are arranged such that successive radiation beam inspection devices inspect different parts of a given region of the beam of radiation during successive pulses of the beam of radiation.

15. The lithographic projection apparatus of claim 1, further comprising:
an actuator that moves at least the barrier at a constant velocity relative to the projection system;
wherein the radiation beam is pulsed;
wherein the barrier to the radiation in the radiation beam inspection device has a plurality of apertures; and
wherein the spacing of the apertures, the velocity of the barrier relative to the projection system, and the pulse rate of the beam are arranged such that successive apertures allow different portions of a given region of the beam of radiation to pass through the barrier to the radiation sensor during successive pulses of the beam of radiation.

16. A radiation beam inspection device, comprising
a radiation barrier having a plurality of apertures, each aperture permits a portion of a beam of radiation that is incident on the radiation beam inspection device to pass through the barrier, wherein the radiation beam is pulsed;
an actuator that moves the radiation barrier at a constant velocity relative to a projection system, wherein a spacing of the apertures, the velocity of the barrier relative to a projection system, and a pulse rate of the beam are arranged such that successive apertures allow different portions of a given region of the beam to pass through the barrier to the radiation sensor during successive pulses; and
a radiation sensor that detects an intensity of the radiation passing through the aperture and a position, relative to the aperture, at which the radiation passing through the aperture is incident on the radiation sensor.

17. The radiation beam inspection device according to claim 16, further comprising:
an actuator that moves at least the radiation barrier relative to a position of the beam of radiation, such that the aperture intersects the beam of radiation at a plurality of different locations within a cross-section of the beam.

18. A method of inspecting a beam of radiation, comprising:
pulsing the beam of radiation;
inspecting at least a portion of the beam of radiation using a radiation beam inspection device that comprises a barrier to the radiation, the barrier having a plurality of apertures, each aperture permits a portion of the radiation beam to pass through the barrier, and a radiation sensor;
actuating the barrier at a velocity relative to a projection system, wherein the velocity of the barrier and the pulsing rate of the beam are selected such that successive apertures allow different portions of a given region of the beam of radiation to pass therethrough;
detecting an intensity of the beam of radiation passing through one of the apertures using a radiation sensor; and
determining position data, relative to the aperture, at which the beam of radiation passing through the aperture is incident on the radiation sensor.

19. The method of claim 18, wherein:
inspecting the beam of radiation a plurality of times to produce a plurality of radiation intensities data by, intersecting the beam of radiation with one of the plurality of apertures at a different location within the cross-section of the beam on each of the plurality of inspection times;
determining the intensity profile of at least a part of the beam of radiation using the produced intensity data; and
determining a direction of propagation of at least a portion of the beam of radiation using the determined position data.

20. The method of claim 19, further comprising:
using a lithographic apparatus to generate the beam of radiation;
using the lithographic apparatus to project a modulated beam of radiation onto a substrate;
wherein at least one setting of the lithographic apparatus is set, for the step of projecting a modulated beam of radiation onto the substrate, using the results of the inspection step.

* * * * *

UNITED STATES PATENT AND TRADEMARK OFFICE
CERTIFICATE OF CORRECTION

PATENT NO. : 7,307,694 B2  Page 1 of 1
APPLICATION NO. : 11/169307
DATED : December 11, 2007
INVENTOR(S) : Willem Jurrianus Venema It is certified that error appears in the above-identified patent and that said Letters Patent is hereby corrected as shown below:

Column 24, line 30-31 please replace "barrier, and a radiation sensor;" with --barrier;--.

Signed and Sealed this

Thirteenth Day of May, 2008

JON W. DUDAS
*Director of the United States Patent and Trademark Office*